United States Patent
Sekino

(10) Patent No.: US 10,285,279 B2
(45) Date of Patent: May 7, 2019

(54) SEMICONDUCTOR DEVICE AND METHOD FOR MANUFACTURING THE SAME

(71) Applicant: FUJI ELECTRIC CO., LTD., Kawasaki-shi, Kanagawa (JP)

(72) Inventor: Yusuke Sekino, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/881,423

(22) Filed: Oct. 13, 2015

(65) Prior Publication Data

US 2016/0143187 A1    May 19, 2016

(30) Foreign Application Priority Data

Nov. 13, 2014    (JP) .................................. 2014-230760

(51) Int. Cl.
*H05K 7/20* (2006.01)
*H05K 3/32* (2006.01)
(Continued)

(52) U.S. Cl.
CPC ............... *H05K 3/32* (2013.01); *H01L 23/40* (2013.01); *H01L 23/4006* (2013.01);
(Continued)

(58) Field of Classification Search
CPC ........... H05K 7/209; H05K 2201/1059; H05K 2201/10871; H05K 3/3447; H05K 3/308;
(Continued)

(56) References Cited

U.S. PATENT DOCUMENTS 3,702,422 A * 11/1972 Schor ................. H01R 13/7197
                                                              333/182
5,065,282 A * 11/1991 Polonio .................. H01L 24/32
                                                              174/547

(Continued)

FOREIGN PATENT DOCUMENTS

JP    S61-207072 U    12/1986
JP    H05-243439 A     9/1993
(Continued)

OTHER PUBLICATIONS

Japan Patent Office, "Office Action for Japanese Patent Application No. 2014-230760," dated Jul. 13, 2018.

*Primary Examiner* — Robert J Hoffberg
(74) *Attorney, Agent, or Firm* — Manabu Kanesaka

(57) ABSTRACT

A semiconductor device includes a semiconductor module which has an external terminal protruding from one surface thereof; a printed circuit board which is electrically and mechanically connected to the external terminal of the semiconductor module; a heatsink which abuts against the other surface of the semiconductor module opposite to the one surface; and a joint member which serves as an elastic support column having a first head portion and a second head portion. The first head portion is shaped like a truncated cone and disposed at one end of the elastic support column, and the second head portion is disposed at the other end of the elastic support column. The semiconductor module, the printed circuit board and the heat sink are integrated by the first head portions and the second head portions.

11 Claims, 13 Drawing Sheets

(51) Int. Cl.
*H01L 23/40* (2006.01)
*H05K 3/30* (2006.01)
*H05K 3/34* (2006.01)

(52) U.S. Cl.
CPC ......... *H01L 23/4093* (2013.01); *H05K 3/308* (2013.01); *H05K 7/209* (2013.01); *H05K 7/2039* (2013.01); *H01L 2023/4043* (2013.01); *H01L 2023/4081* (2013.01); *H05K 3/3447* (2013.01); *H05K 2201/1059* (2013.01); *H05K 2201/10871* (2013.01)

(58) Field of Classification Search
CPC ........ H05K 3/32; H05K 7/20409; H05K 7/02; H01L 25/162; H01L 23/49575; H01L 23/4006; H01L 23/49555; H01L 23/4334; H01L 2924/181; H01L 2924/13055; H01L 2225/1029; H01L 2224/48091; H01L 2224/48137; H01L 2023/4043; H01L 23/4093; H01L 2023/4081
See application file for complete search history.

(56) References Cited

U.S. PATENT DOCUMENTS

| | | | | |
|---|---|---|---|---|
| 5,656,798 | A * | 8/1997 | Kubo | H01L 21/486 174/263 |
| 5,969,947 | A * | 10/1999 | Johnson | H01L 23/4093 174/16.3 |
| 6,011,222 | A * | 1/2000 | Sekiya | H01R 12/58 174/265 |
| 6,229,101 | B1 * | 5/2001 | Sekiya | H01R 12/58 174/265 |
| 6,259,039 | B1 * | 7/2001 | Chroneos, Jr. | H01R 43/0256 174/260 |
| 7,158,372 | B2 * | 1/2007 | Sanada | H05K 3/308 137/557 |
| 7,345,891 | B2 * | 3/2008 | Barsun | H05K 3/301 361/803 |
| 7,397,666 | B2 * | 7/2008 | Barsun | H05K 7/1431 165/104.33 |
| 7,743,563 | B2 * | 6/2010 | Hilmy | E04H 9/02 52/167.1 |
| 7,777,325 | B2 * | 8/2010 | Yamada | H05K 3/325 257/690 |
| 7,872,868 | B2 * | 1/2011 | Yamanaka | H01L 23/3675 361/679.53 |
| 8,007,292 | B2 * | 8/2011 | Kunert | H05K 3/308 439/572 |
| 8,144,470 | B2 * | 3/2012 | Maloney | H01L 23/4093 361/694 |
| 8,159,822 | B2 * | 4/2012 | Kanschat | H01L 23/24 165/184 |
| 8,220,878 | B2 * | 7/2012 | Yoshinaga | B60T 8/368 303/119.3 |
| 8,317,436 | B2 * | 11/2012 | Harif | B23B 27/12 407/103 |
| 8,934,247 | B2 * | 1/2015 | Chen | H01L 23/40 165/80.3 |
| 9,041,196 | B2 * | 5/2015 | Bayerer | H01L 23/049 257/678 |
| 9,147,634 | B2 * | 9/2015 | Kodama | H05K 7/2049 |
| 9,423,191 | B2 * | 8/2016 | Whitney | H01L 23/4093 |
| 9,578,790 | B2 * | 2/2017 | Kodama | B60L 3/003 |
| 9,706,659 | B2 * | 7/2017 | Burleson | H05K 1/18 |
| 10,104,813 | B2 * | 10/2018 | Cheng | H05K 7/209 |
| 2010/0038758 | A1 * | 2/2010 | Stolze | H01L 23/367 257/675 |
| 2011/0299253 | A1 | 12/2011 | Nabilek | |
| 2013/0050954 | A1 * | 2/2013 | Albrecht, III | H05K 1/0203 361/720 |
| 2013/0277820 | A1 * | 10/2013 | Hotta | H01L 23/4006 257/712 |
| 2014/0035118 | A1 * | 2/2014 | Bayerer | H01L 23/049 257/690 |
| 2015/0116945 | A1 * | 4/2015 | Minamio | H01L 23/4006 361/709 |

FOREIGN PATENT DOCUMENTS

| | | |
|---|---|---|
| JP | 2008-306138 A | 12/2008 |
| JP | 2010-180268 A | 8/2010 |
| JP | 2011-254065 A | 12/2011 |

* cited by examiner

Prior Art

SEMICONDUCTOR DEVICE AND METHOD FOR MANUFACTURING THE SAME

CROSS-REFERENCES TO RELATED APPLICATIONS

The present application claims priority from Japanese Application No. 2014-230760 filed Nov. 13, 2014, the disclosure of which is incorporated herein.

BACKGROUND OF THE INVENTION

Field of the Invention

The present invention relates to a semiconductor device and a method for manufacturing the same.

Description of the Background Art

FIG. 13 is a side view of a conventional semiconductor device 500 in which a semiconductor module 51, a printed circuit board 52 and a heatsink 53 are integrated with one another.

The semiconductor device 500 is provided with the semiconductor module 51, the printed circuit board 52, the heatsink 53, and metal screws 54 and 55 serving as joint members. The first metal screws 54 fix the printed circuit board 52 and the semiconductor module 51 to each other. The second metal screws 55 fix the semiconductor module 51 and the heatsink 53 to each other through latches 51b placed in the semiconductor module 51. In addition, metal pins 51a as external terminals constituting the semiconductor module 51 are fixed to a circuit wiring (not shown) of the printed circuit board 52 by soldering etc.

Patent Literature 1 describes a semiconductor device in which a printed circuit board is fixed to an upper surface of a semiconductor module and a heatsink is fixed to a lower surface of the semiconductor module. Patent Literature 1 also describes that, in the semiconductor device, joint members made of plastic with the shapes of circular cones are made to penetrate dowels provided in the semiconductor module and lower ends of the joint members are press-fitted into the heatsink so that the printed circuit board, the semiconductor module and the heatsink can be fixed to one another in a lump.

In addition, Patent Literature 2 describes that, in a semiconductor device in which a printed circuit board is fixed to an upper surface of a semiconductor module and a heatsink is fixed to a lower surface of the semiconductor module, fastening pins constituted by elastic elements with the shapes of circular cones are press-fitted into the printed circuit board to thereby fix the printed circuit board and the semiconductor module to each other.

CITATION LIST

Patent Document

Patent Literature 1: Japanese Unexamined Patent Application Publication No. JP-A-2011-254065
Patent Literature 2: Japanese Unexamined Utility Model Application Publication No. JP-UM-A-S61-207072

DISCLOSURE OF THE INVENTION

Problem to be Solved by the Invention

However, in the semiconductor device 500 shown in FIG. 13, the printed circuit board 52 and the semiconductor module 51 are fixed to each other by the first metal screws 54 and the semiconductor module 51 and the heatsink 53 are fixed to each other by the second metal screws 55. Therefore, a step for managing the clamping torque or the rotation speed of each metal screw is required, and the number of assembly man-hours is increased in order to finally fasten the metal screw after temporarily fastening the metal screw.

In Patent Literature 1, the constituent members of the semiconductor module, the printed circuit board and the heatsink are integrated by the joint members through the dowel portions. However, each of the joint members is shaped like a circular cone. Therefore, in some cases, there may arise a problem that the joint members are fitted loosely in the dowel portions and come off upward when a load such as an oscillating load is applied thereto. In this case, there is a possibility that the constituent members of the printed circuit board, the semiconductor module, and the heatsink may be joined loosely and unstably.

In addition, Patent Literature 2 does not describe that the printed circuit board, the semiconductor module, and the heatsink are connected in a group.

SUMMARY OF THE INVENTION

In order to solve the foregoing problems, an object of the invention is to provide a semiconductor device in which even when a load such as an oscillating load is applied, constituent members of a semiconductor module, a printed circuit board and a heatsink are joined stably and the number of assembly man-hours can be further reduced, and the method for manufacturing the semiconductor device.

In order to achieve the foregoing object, a first embodiment of the invention is directed to a semiconductor device including: a semiconductor module which has an external terminal protruding from one surface; a printed circuit board which is electrically and mechanically connected to the external terminal of the semiconductor module; a heatsink which abuts against the other surface of the semiconductor module opposite to the one surface; and a joint member which serves as an elastic support column having a first head portion and a second head portion. The first head portion is shaped like a truncated cone and is disposed at one end of the elastic support column, the second head portion is disposed at the other end of the elastic support column, and the semiconductor module, the printed circuit board and the heatsink are integrated by the first head portion and the second head portion.

A second embodiment of the invention is directed to a method for manufacturing a semiconductor device, including the steps of: preparing a semiconductor module which has an external terminal protruding from one surface, a printed circuit board, a heatsink, and a joint member which serves as an elastic support column having truncated conical head portions at opposite ends; electrically and mechanically connecting the printed circuit board to the external terminal of the semiconductor module; abutting the heatsink against the other surface of the semiconductor module; extending the joint member to thereby insert the joint member into through holes disposed in alignment in the semiconductor module, the printed circuit board and the heatsink respectively; and pinching the semiconductor module, the printed circuit board and the heatsink between the truncated conical head portions disposed at the opposite ends of the joint member to thereby fix the semiconductor module, the printed circuit board and the heatsink to one another by compression force of the joint member.

According to the invention, it is possible to provide a semiconductor device in which even when a load such as an oscillating load is applied, constituent members are joined stably and the number of man-hours can be further reduced, and a method for manufacturing the semiconductor device.

DETAILED DESCRIPTION OF THE INVENTION

First Embodiment

Figure 1A:
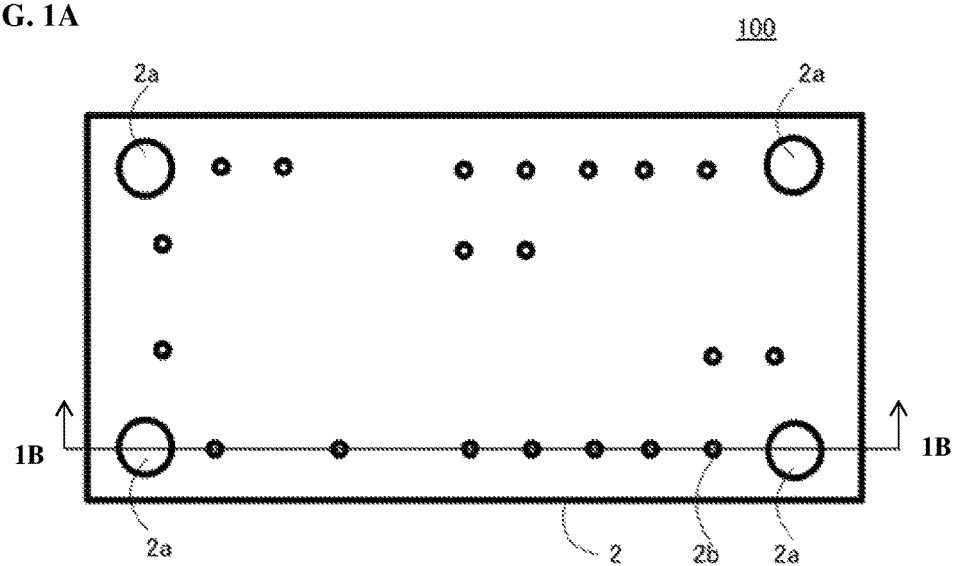
FIGS. 1A and 1B are structural views of a semiconductor device 100 according to a first embodiment.
Figure 1B:
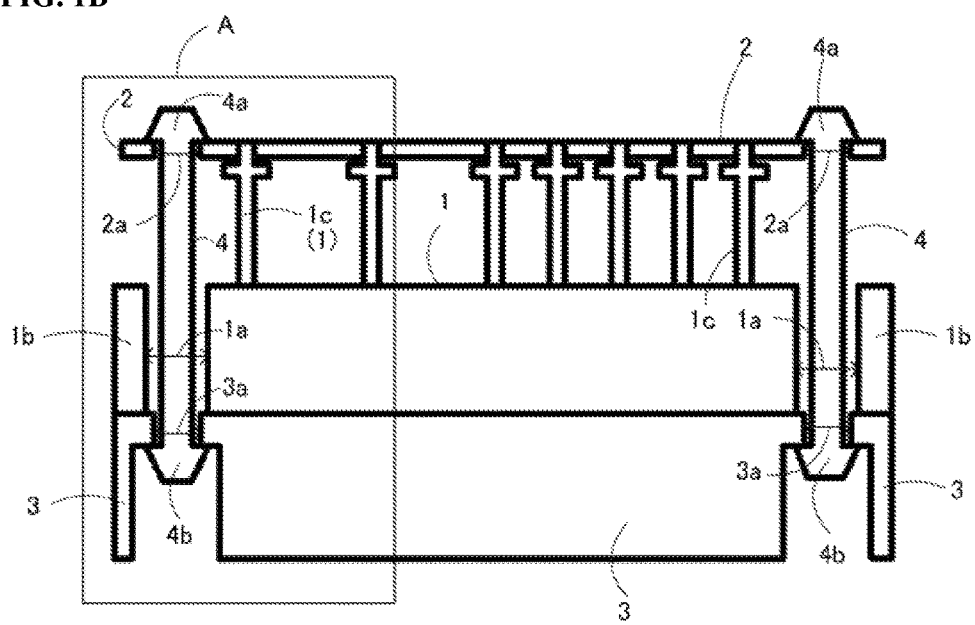

FIGS. 1A and 1B are structural views of a semiconductor device 100 according to a first embodiment of the invention. FIG. 1A is a plan view. FIG. 1B is a sectional view taken along the line 1B-1B in FIG. 1A. Here, FIG. 1A shows a printed circuit board 2 constituting the semiconductor device 100.

The semiconductor device 100 is provided with a semiconductor module 1, the printed circuit board 2, a heatsink 3, and joint members 4 serving as elastic support columns.

Through holes 1a are arranged in the semiconductor module 1. Through holes 2a and 3a corresponding to the through holes 1a are also arranged in the printed circuit board 2 and the heatsink 3. A plurality of external terminals 1c protruding from one surface (upper surface in FIG. 1B) of a resin casing 1b of the semiconductor module 1 are inserted into small holes 2b of the printed circuit board 2 arranged in corresponding positions. The external terminals 1c and the small holes 2b are joined to each other by soldering. In this manner, the printed circuit board 2 is fixed to the semiconductor module 1, and the semiconductor module 1 and the printed circuit board 2 are electrically connected to each other. The through holes 1a are arranged in peripheral portions of the resin casing 1b constituting the semiconductor module 1. A first head portion 4a and a second head portion 4b are attached to opposite ends of each of the columnar joint members 4.

When the joint members 4 are inserted into the through holes 1a, 2a and 3a and the joint members 4 are compressed, the semiconductor module 1, the printed circuit board 2 and the heatsink 3 sandwiched between the first head portions 4a and the second head portions 4b are fixed in a group and integrated with one another.

Figure 2:
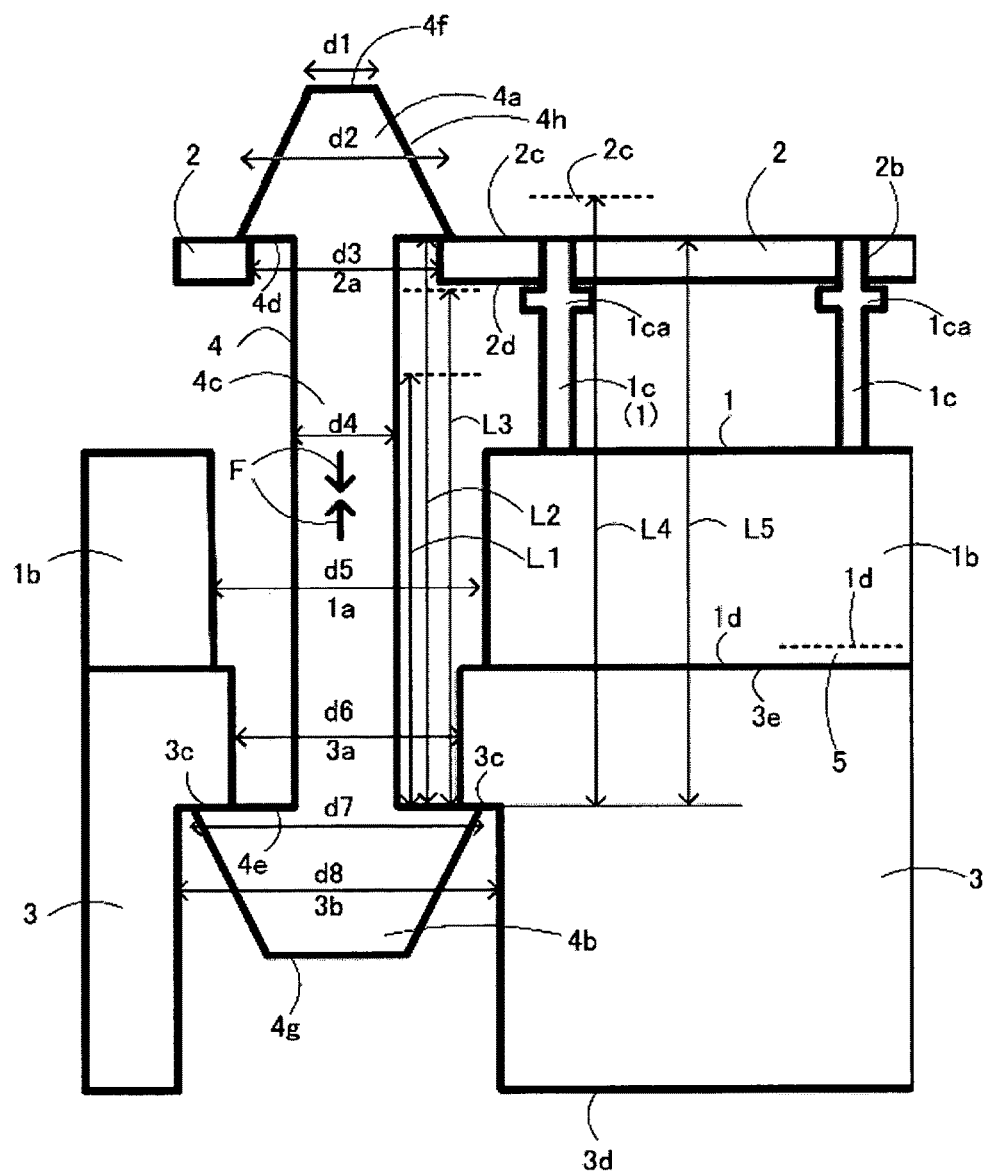
FIG. 2 is an enlarged view of a portion A in FIG. 1B.

FIG. 2 is an enlarged view of a portion A in FIG. 1B. A not-shown semiconductor chip is received in the resin casing 1b of the semiconductor module 1. The through holes 1a for fixation are arranged, for example, in four corners of the resin casing 1b.

The through holes 2a for fixation corresponding to the through holes 1a of the resin casing 1b are arranged in the printed circuit board 2. In addition, the external terminals 1c are inserted into and joined to the large number of small holes 2b arranged in the printed circuit board 2 by soldering. Thus, the external terminals 1c are connected to not-shown circuit wiring of the printed circuit board 2. Incidentally, in FIG. 2, the reference symbol 2c designates a top surface of the printed circuit board 2; and reference symbol 2d designates a back surface of the printed circuit board 2.

The through holes 3a serving for fixation correspondingly to the through holes 1a of the resin casing 1b are formed in the heatsink 3. The heatsink 3 is made to abut against the other surface (lower surface in FIG. 2) of the resin casing 1b of the semiconductor module 1 opposite to the surface from which the external terminals 1c protrude. On this occasion, the centers of the through holes 1a, 2a and 3a are disposed substantially in alignment with one other. Next, the joint members 4 are extended from the sides of the first head portions 4a so as to be inserted into the through holes 2a of the printed circuit board 2, the through holes 1a of the semiconductor module 1 and the through holes 3a of the heatsink 3. Then, the joint members 4 are compressed due to their compression force F. In this manner, the printed circuit board 2, the semiconductor module 1 and the heatsink 3 are sandwiched between the first head portions 4a and the second head portions 4b of the joint members 4 so as to be fixed to one another. Incidentally, in the embodiment, protruding portions 1ca are provided in joint portions of the external terminals 1c to the printed circuit board. Thus, since the printed circuit board 2 is supported mechanically, it is possible to effectively prevent the soldered joints between the external terminals 1c and the printed circuit board 2 from being separated due to the compression force F.

Incidentally, in FIG. 2, the reference symbol d1 designates the diameter of a front end 4f of the first head portion 4a; the reference symbol d2 designates the diameter of a bottom 4d of the first head portion 4a; the reference symbol d3 designates the diameter of the through hole 2a of the printed circuit board 2; the reference symbol d4 designates the diameter of a rod portion 4c of the joint member 4; the reference symbol d5 designates the diameter of the through hole 1a of the semiconductor module 1; the reference symbol d6 designates the diameter of the through hole 3a of the heatsink 3; the reference symbol d7 designates the diameter of a bottom 4e of the second head portion 4b; and the reference symbol d8 designates the diameter of a hole 3b of the heatsink 3.

In addition, the reference symbol L1 designates the free length of the rod portion 4c of the joint member 4 before attachment; the reference symbol L2 designates the length of the rod portion 4c of the joint member 4 after attachment; the reference symbol L3 designates the free length of the joint member 4 before attachment; and the reference symbol L4 designates the free length between the top surface 2c of the printed circuit board 2 and a step portion 3c of the heatsink 3 before attachment. Incidentally, a gap 5 is formed between a back surface 1d of the semiconductor module 1 and a top surface 3e of the heatsink 3 in the state before attachment. The reference symbol L5 designates a length between the top surface 2c of the printed circuit board 2 and the step portion 3c of the heatsink 3 after attachment. Incidentally, the gap 5 is eliminated between the back surface 1d of the semiconductor module 1 and the top surface 3e of the heatsink 3 in the state after attachment, and the back surface 1d and the top surface 3e pressure contact each other.

Figure 3A:
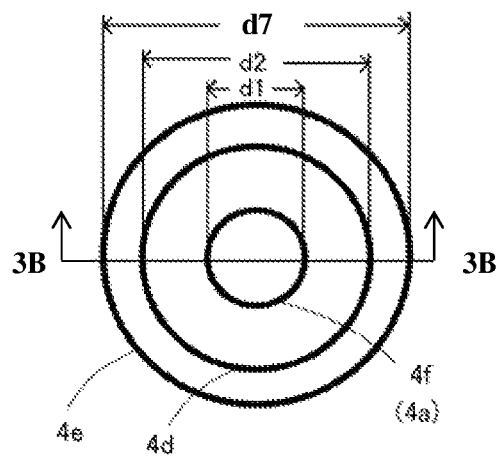
FIGS. 3A and 3B are structural views of a joint member 4.
Figure 3B:
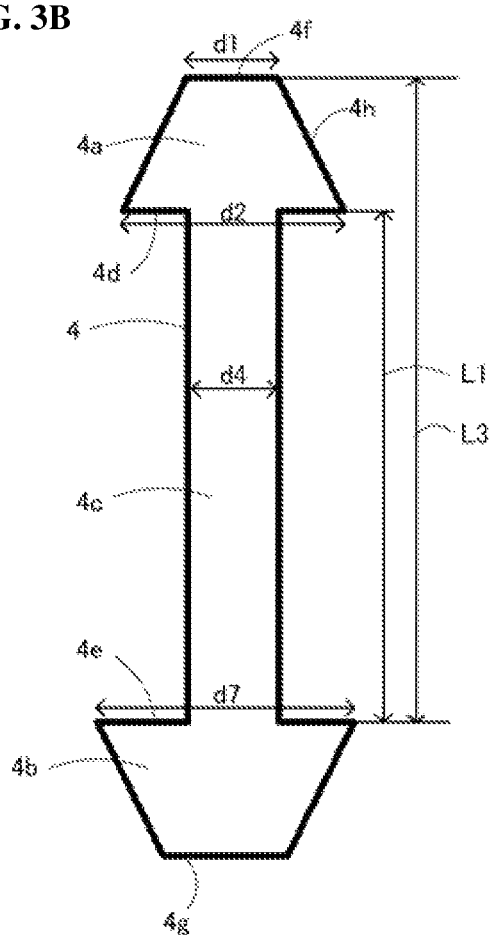

FIGS. 3A and 3B are structural views of each joint member 4 serving as an elastic support column. FIG. 3A is a top view. FIG. 3B is a sectional view taken along the line 3B-3B in FIG. 3A. The joint member 4 is made of an elastic element. The joint member 4 is provided with the rod portion 4c, the first head portion 4a, and the second head portion 4b. The first head portion 4a is shaped like a truncated cone and disposed at one end of the rod portion 4c. Incidentally, in FIG. 3B, the reference symbol 4h designates a taper portion (conical surface) of the first head portion 4a. Incidentally, in the embodiment, the second head portion 4b is also shaped like a truncated cone similarly to the first head portion 4a. However, the second head portion 4b is not inserted into the through holes 1a, 2a and 3a like the first head portion 4a. Thus, the second head portion 4b does not have to be shaped like a truncated cone. The second head portion 4b may be formed into any shape as long as the diameter d7 of the bottom of the second head portion 4b is larger than the diameter d4 of the rod portion and the diameter d6 of the through hole 3a of the heatsink 3 and the second head portion 4b can be received in the hole 3b of the heatsink 3.

In addition, although the embodiment has been illustrated in the case in which the first head portion 4a is shaped like a circular truncated cone, the first head portion 4a may be shaped like a square truncated cone. In this case, the planar shape of each of the through holes 1a, 2a and 3a may be set not as a circular shape but as a square shape.

It is preferable that the hardness of the joint member 4 is from HV30 to HV70 (based on JIS K 6523). It is for the following reasons. That is, if the hardness of the joint member 4 is less than HV30, the joint member 4 will become too soft to obtain satisfactory compression force. On the other hand, if the hardness of the joint member 4 is larger than HV70, the joint member 4 will become too hard to be inserted into the through holes 2a and 3a so that it will be difficult to perform joining. In addition, for example, a material harder than an eraser but softer than a tire is preferably used as the material of the joint member 4. The joint member 4 can be formed, for example, in such a manner that liquid rubber is poured into a mold and solidified.

In the embodiment, the diameters d1 to d8 of the through holes 1a, 2a and 3a, the hole 3b and the respective portions of the joint member 4 are set to satisfy the relations d8>d7>d6>d2>d3>d4, d5>d2 and d3>d1. In addition, the respective lengths L1 to L5 are set to satisfy the relations L1<L2, L4>L3, L4>L5, and L2=L5. In this manner, the compression force F occurs in the joint member 4 so that the printed circuit board 2, the semiconductor module 1 and the heatsink 3 can be securely fixed to one another. As a result, even when an oscillating load is applied, the respective constituent members are not loosely joined. In addition, the respective members are fixed in a group by the joint members 4 which are used in place of metal screws. Accordingly, the number of assembly man-hours can be reduced.

Incidentally, although the size relation of the diameters d1 and d4 is set to satisfy d1=d4 in FIG. 3B, it will also go well even when one of the diameters d1 and d4 is larger than the other.

In addition, the second head portion 4b of the joint member 4 does not protrude from the back surface 3d of the heatsink 3 so that the back surface 3d can be kept flat. Therefore, when any member such as a coolant is further added to the back surface 3d of the heatsink 3, the added member can be disposed on and securely joined to the heatsink 3.

Second Embodiment

FIGS. 4 to 11 are sectional views showing the sequence of manufacturing steps of a method for manufacturing the semiconductor device 100 according to a second embodiment of the invention.

Figure 4:
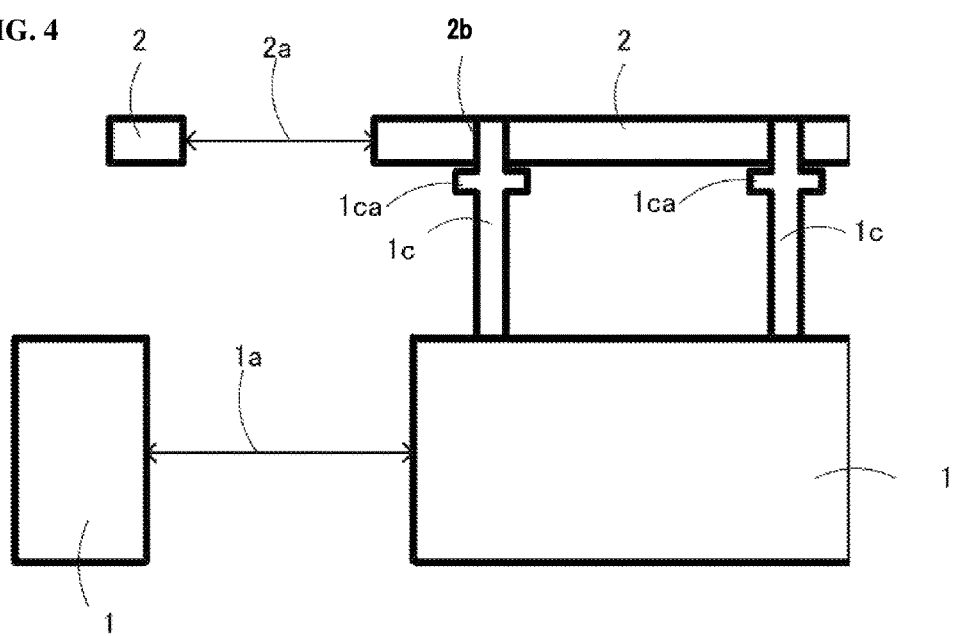
FIG. 4 is a sectional view of a step of manufacturing the semiconductor device 100 according to a second embodiment.

First, in FIG. 4, the external terminals 1c of the semiconductor module 1 are inserted into the small holes 2b of the printed circuit board 2 and fixed thereto by soldering etc. The external terminals 1c are connected to the not-shown circuit wiring of the printed circuit board 2. In addition, in the embodiment, the protruding portions 1ca are provided in the external terminals 1c. In this manner, alignment of the printed circuit board 2 in the axial direction of the external terminals 1c can be made easy.

Figure 5:
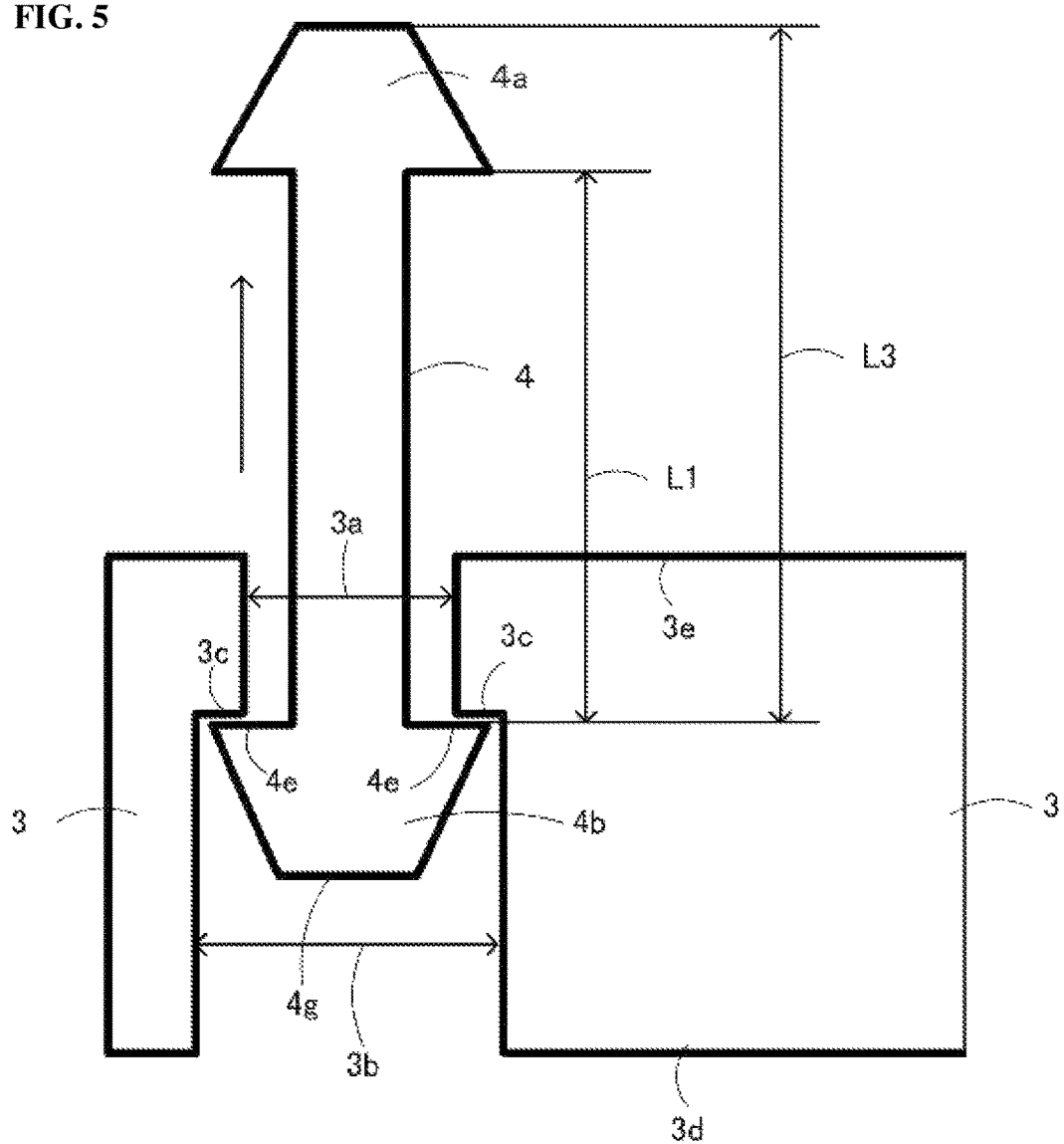
FIG. 5 is a sectional view of a step of manufacturing the semiconductor device 100 according to the second embodiment following FIG. 4.

Then, in FIG. 5, the first head portions 4a of the joint members 4 penetrate the through holes 3a of the heatsink 3 upward from below. The holes 3b are arranged on the side of the back surface 3d of the heatsink 3. The through holes 3a each of which has a smaller diameter than that of the hole 3b and which penetrate the heatsink 3 up to the top surface 3e are arranged in center portions of the holes 3b. The step portions 3c are formed in connection portions between the holes 3b and the through holes 3a. The bottoms 4e of the second head portions 4b contact the step portions 3c so that the second head portions 4b can be prevented from coming off upward. In addition, each of the holes 3b is set to be deep enough to embed the second head portion 4b therein so that the second head portions 4b can be prevented from protruding from the bottom 3d.

Figure 6:
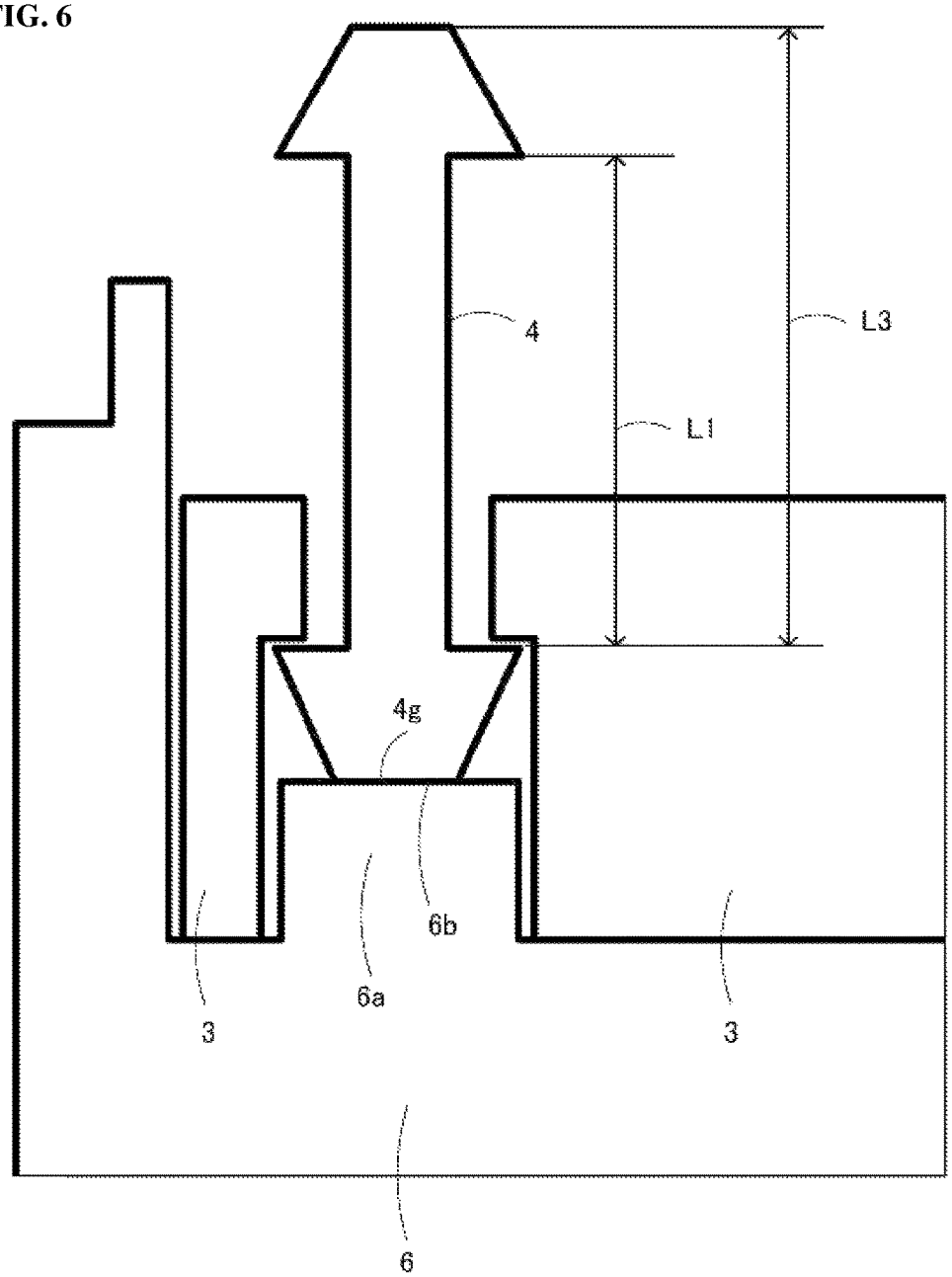
FIG. 6 is a sectional view of a step of manufacturing the semiconductor device 100 according to the second embodiment following FIG. 5.

Then, in FIG. 6, the heatsink 3 and the joint members 4 are mounted on a support table 6. On this occasion, front ends 4g of the second head portions 4b contact front ends 6b of convex portions 6a of the support table 6, and the joint members 4 is disposed substantially perpendicularly.

Figure 7:
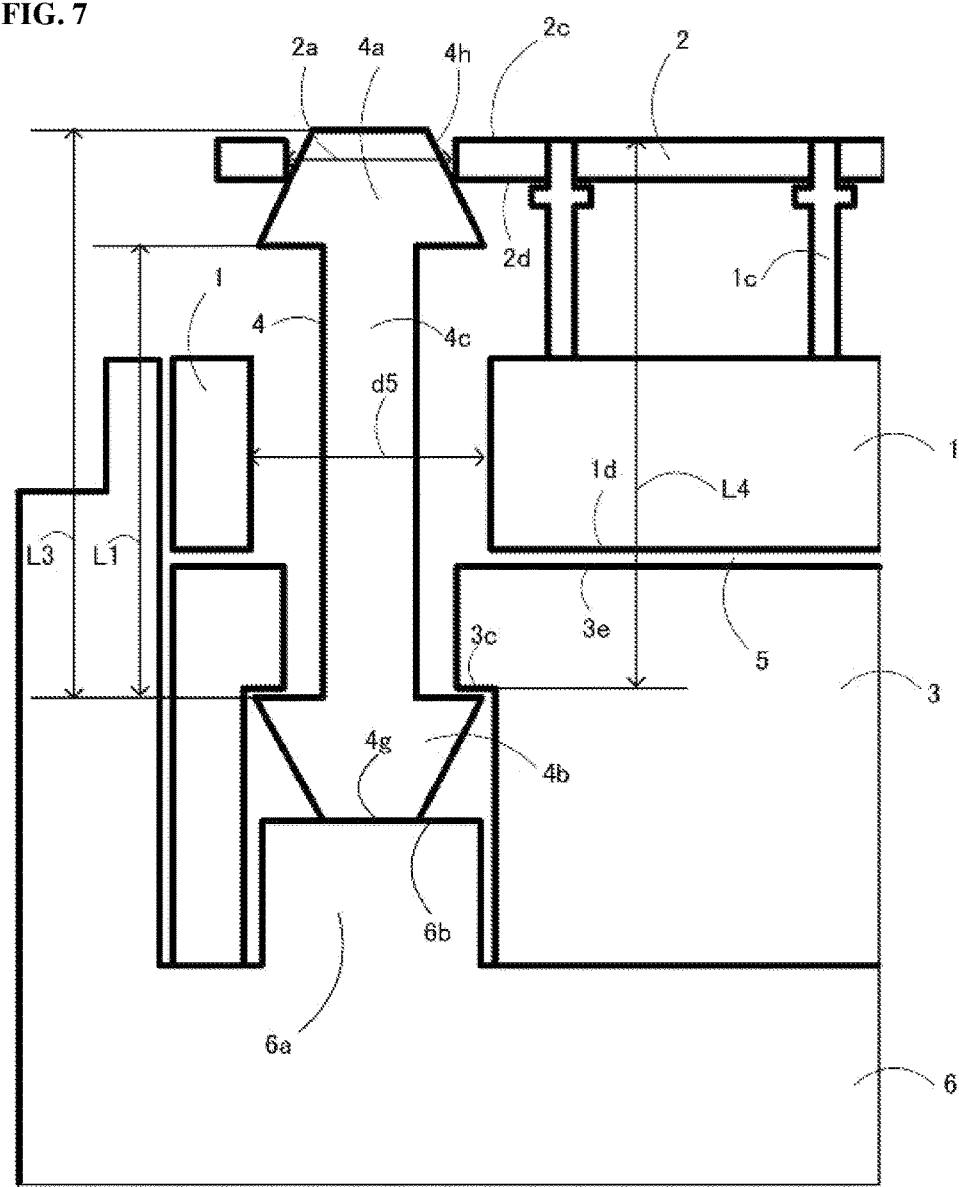
FIG. 7 is a sectional view of a step of manufacturing the semiconductor device 100 according to the second embodiment following FIG. 6.

Then, in FIG. 7, the semiconductor module 1 to which the printed circuit board 2 has been fixed is put onto the heatsink 3 from above so that the joint members 4 are inserted into the through holes 1a of the semiconductor module 1. The taper portions 4h of the first head portions 4a of the joint members 4 contact the outer circumferences of the through holes 2a of the printed circuit board 2. In addition, on this occasion, the gap 5 is formed between the back surface 1d of the semiconductor module 1 and the top surface 3e of the heatsink 3.

Figure 8:
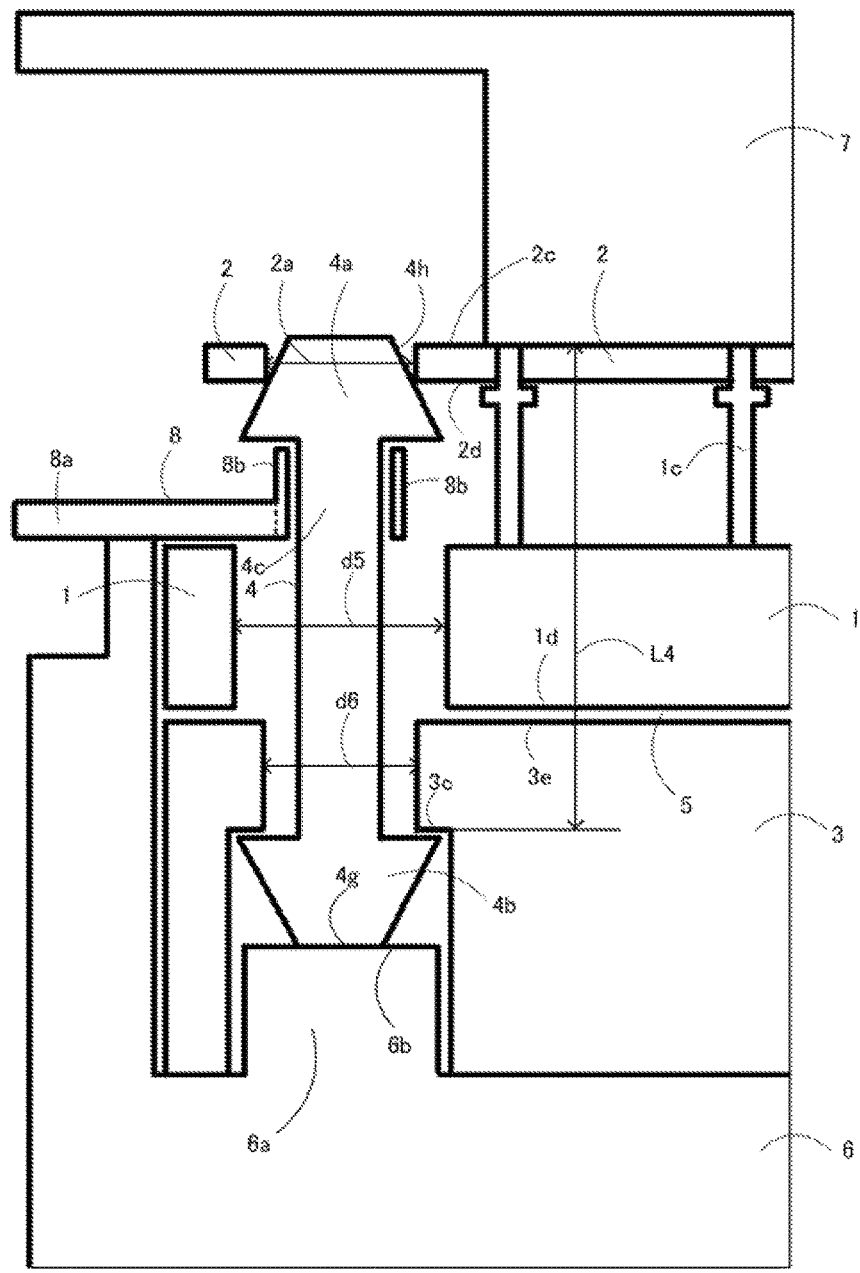
FIG. 8 is a sectional view of a step of manufacturing the semiconductor device 100 according to the second embodiment following FIG. 7.
Figure 12A:
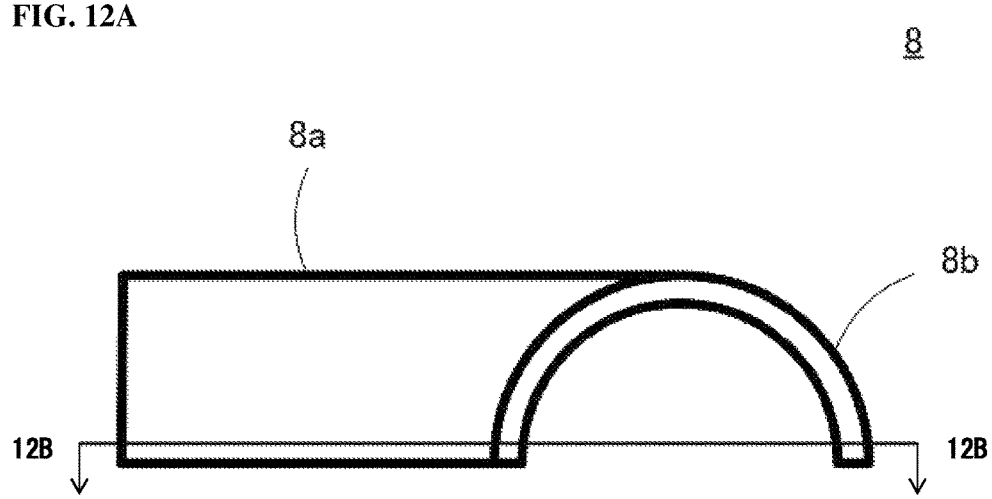
FIGS. 12A and 12B are structural views of a second jig 8.
Figure 12B:
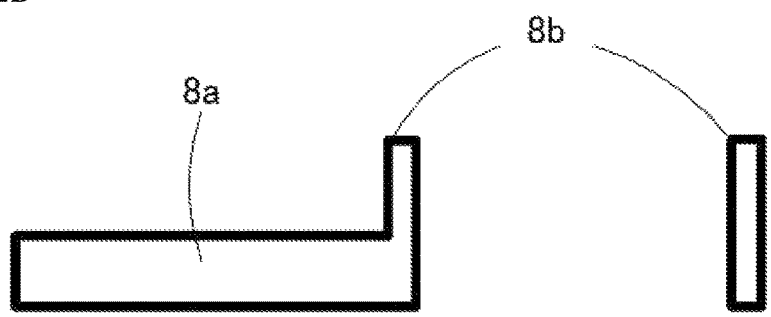
Figure 13:
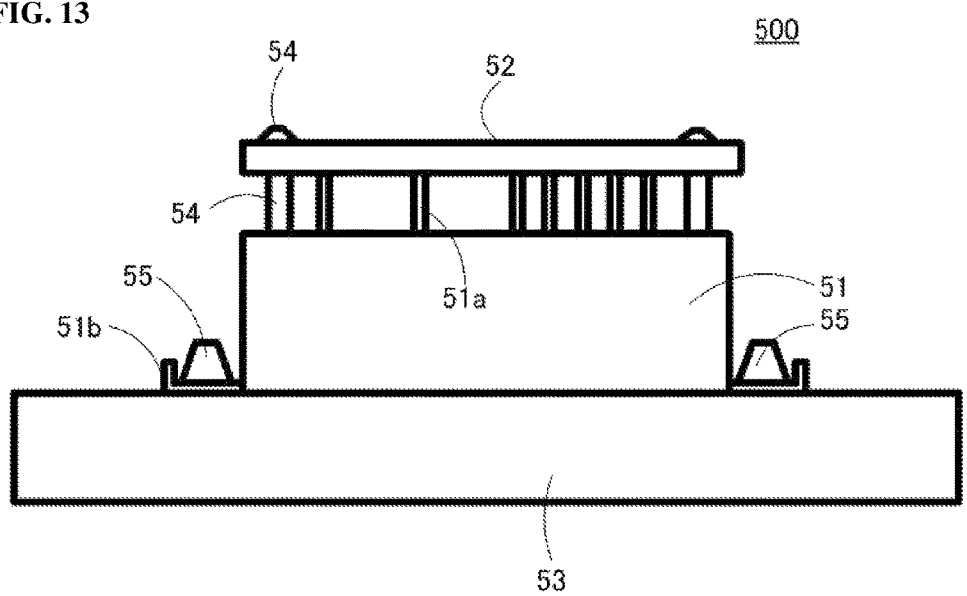
FIG. 13 is a side view of a semiconductor device 500 according to the conventional art.

Then, in FIG. 8, a first jig 7 is mounted on the top surface 2c of the printed circuit board 2, and handle portions 8a of second jigs 8 are mounted on the support table 6. On this occasion, the second jigs 8 are disposed so that semicircular cylinder portions 8b of the second jigs 8 encase the vicinities of the first head portions 4a of the rod portions 4c of the joint members 4. FIGS. 12A and 12B are structural views of each second jig 8. FIG. 12A is a plan view. FIG. 12B is a sectional view taken along the line 12B-12B in FIG. 12A. The second jig 8 is constituted by the handle portion 8a and the semicircular cylinder portion 8b. Force for extending the joint member 4 is transmitted to the semicircular cylinder portion 8b through the handle portion 8a.

Figure 9:
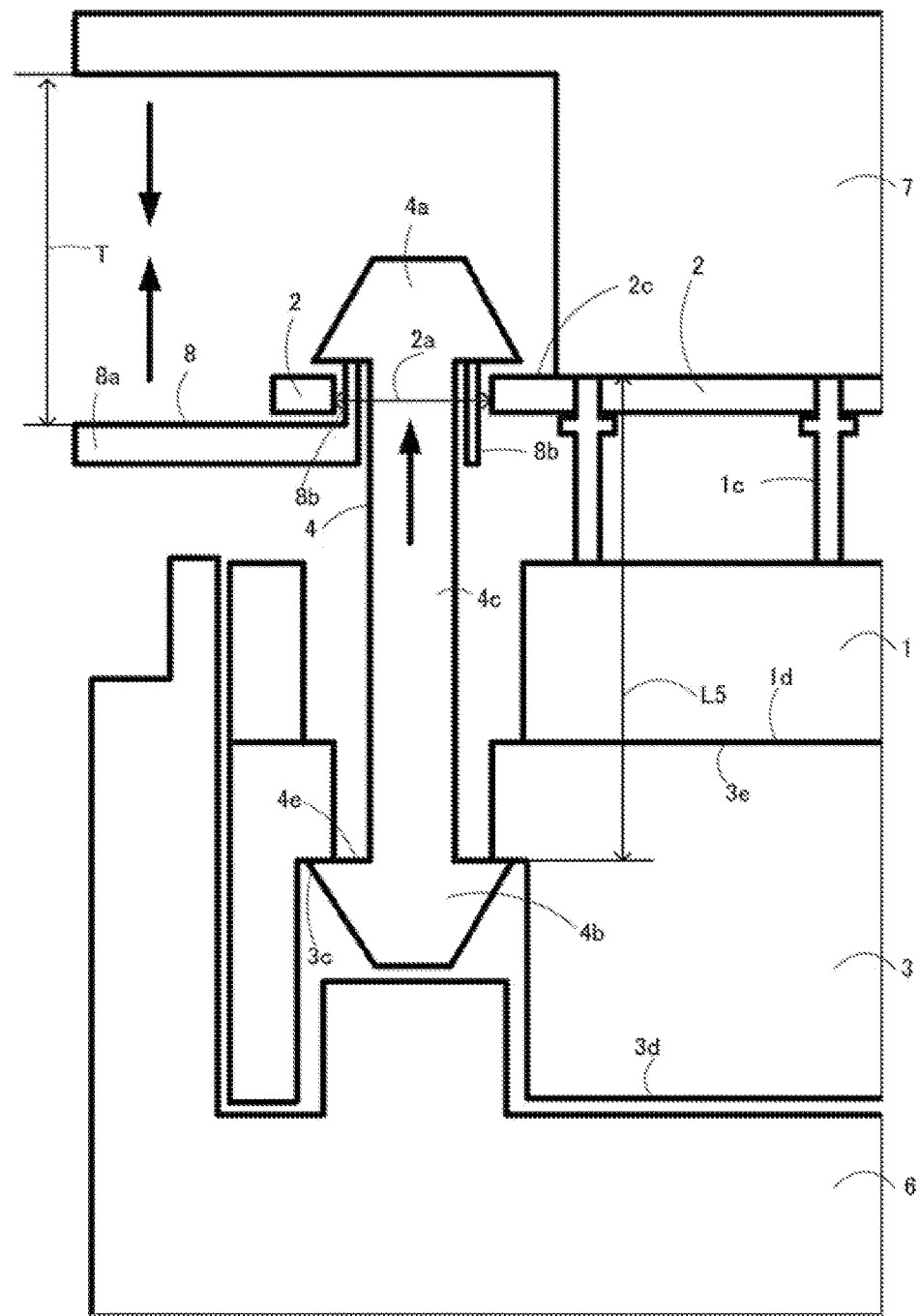
FIG. 9 is a sectional view of a step of manufacturing the semiconductor device 100 according to the second embodiment following FIG. 8.

Then, in FIG. 9, an interval T between the first jig 7 and each of the second jigs 8 is made narrow, with a result that the rod portions 4c of the joint members 4 are extended upward and the first head portions 4a are inserted into the through holes 2a of the printed circuit board 2. On this occasion, the first head portions 4a serving as elastic elements are compressed. After the first head portions 4a have passed through the through holes 2a, the first head portions 4a are expanded to return to their original shapes. In addition, the bottoms 4e of the second head portions 4b contact the step portions 3c of the heatsink 3 to lift up the heatsink 3. The back surface 3d of the heatsink 3 separates the support table 6, and the top surface 3e of the heatsink 3 and the back surface 1d of the semiconductor module 1 tightly contact each other. Even after the heatsink 3 and the semiconductor module 1 are tightly contacting each other, the joint members 4 are extended upward by the semicircular cylinder portions 8b until the first head portions 4a pass through the through holes 2a. Thus, the top surface 3e of the heatsink 3 and the back surface 1d of the semiconductor module 1 pressure contact each other.

Figure 10:
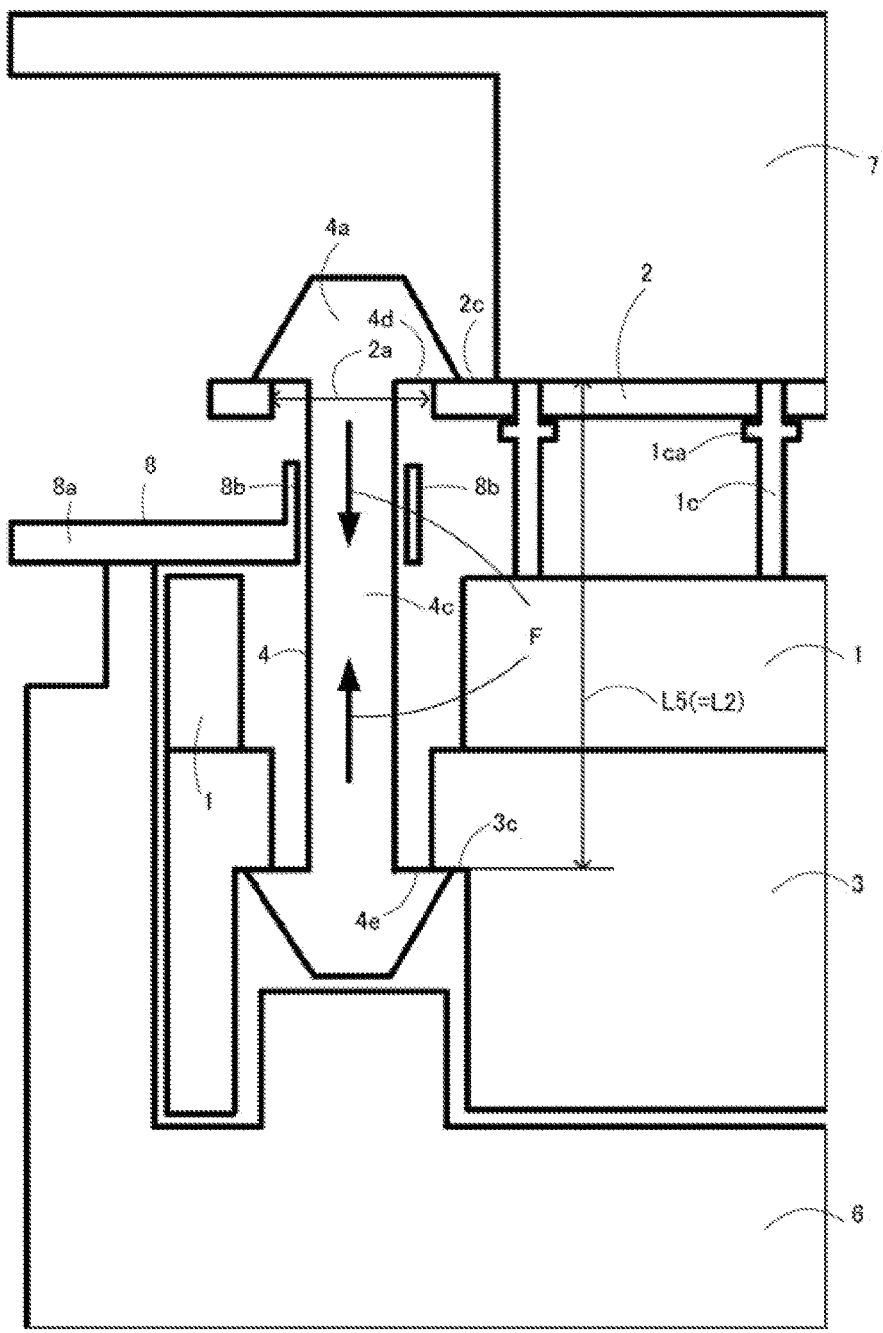
FIG. 10 is a sectional view of a step of manufacturing the semiconductor device 100 according to the second embodiment following FIG. 9.

Then, in FIG. 10, the second jigs 8 are returned to their original positions. On this occasion, the joint members 4 are compressed to generate compression force F. By the compression force F, the printed circuit board 2, the semiconductor module 1 and the heatsink 3 are integrated and fixed stably without being loosened. Incidentally, in the embodiment, the protruding portions 1ca are provided in the external terminals 1c. Therefore, it is possible to prevent the joints between the external terminals 1c and the printed circuit board 2 from being separated due to the compression force F.

Figure 11:
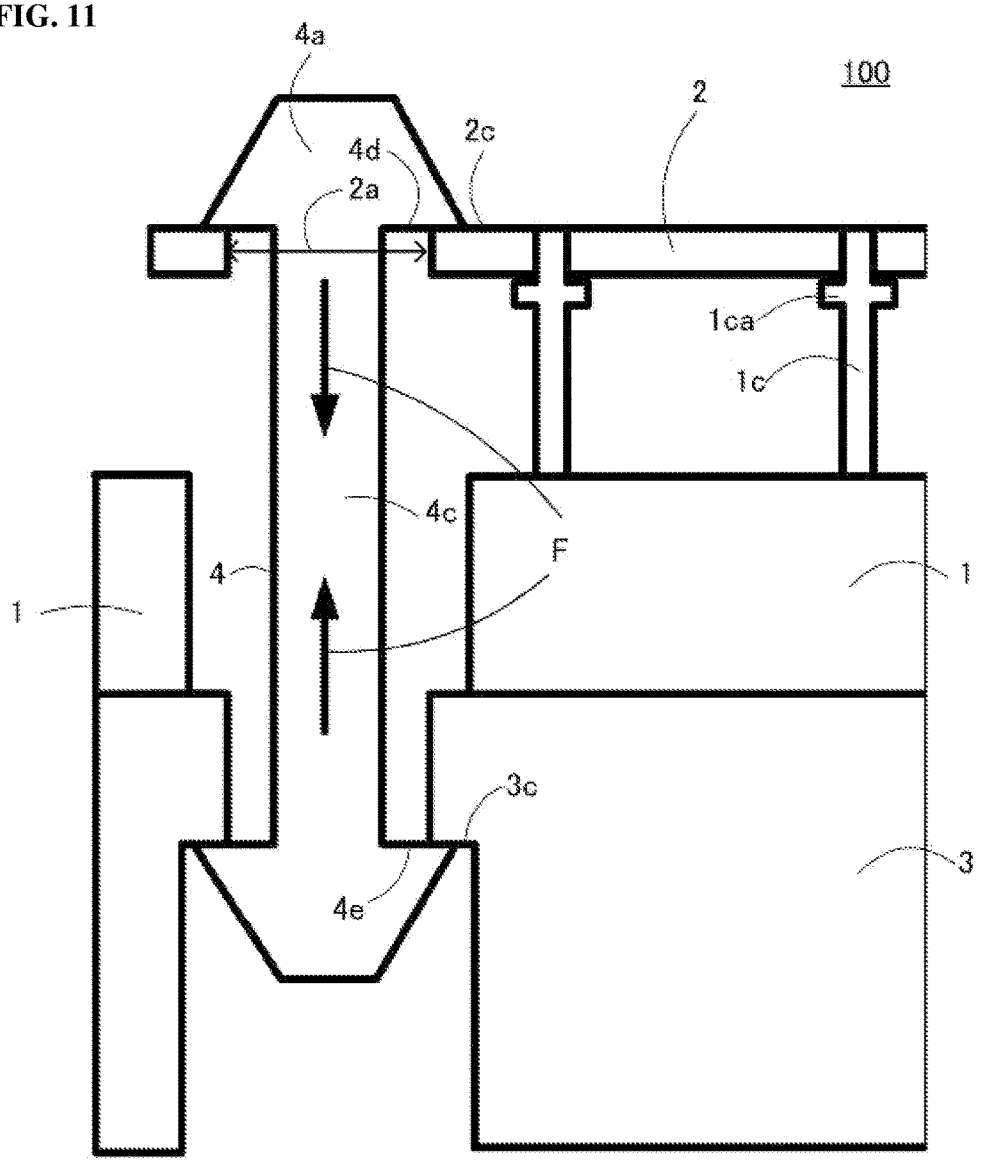
FIG. 11 is a sectional view of a step of manufacturing the semiconductor device 100 according to the second embodiment following FIG. 10.

Then, in FIG. 11, the first jig 7 is removed from the printed circuit board 2, and the second jigs 8 are removed from the joint members 4. Thus, a semiconductor device 100 in which the printed circuit board 2, the semiconductor module 1 and the heatsink 3 are integrated by the joint members 4 is completed.

According to Second Embodiment, the printed circuit board 2, the semiconductor module 1 and the heatsink 3 can be fixed to one another by a simple method of making the first head portions 4a of the joint members 4 penetrate the through holes 2a of the printed circuit board 2 and the through holes 3a of the heatsink 3 respectively. Accordingly, torque management etc. is not required, the step can be simple and the number of man-hours can be reduced, in comparison with a screw method.

What is claimed is:

1. A semiconductor device comprising:
   a semiconductor module having an external terminal protruding from one surface of the semiconductor module in a first direction, the external terminal including a protruding portion extending in a second direction crossing the first direction;
   a printed circuit board electrically and mechanically connected to the external terminal of the semiconductor module;
   a heatsink abutting against another surface of the semiconductor module opposite to the one surface; and
   one unitary joint member including a rod portion, a first head portion and a second head portion, the first head portion having a truncated cone shape including a flat top surface, a bottom surface extending outwardly from an outer surface of the rod portion, and a tapered surface extending from the flat top surface to the bottom surface, the first head portion being disposed at one end of the rod portion, and the second head portion being disposed at another end of the rod portion,
   wherein the first head portion and the second head portion integrate the semiconductor module, the printed circuit board, and
   the heatsink, and the printed circuit board is sandwiched between the first head portion and the protruding portion of the external terminal.

2. The semiconductor device according to claim 1, wherein the joint member is an elastic element having a compression force in the first direction so that the printed circuit board is elastically sandwiched between the first head portion and the protruding portion.

3. The semiconductor device according to claim 2, wherein each of the first and second head portions and the rod portion is a solid piece, and the first and second head portions and the rod portion are formed integrally as one structure.

4. The semiconductor device according to claim 3, wherein the tapered surface of the first head portion is tapered so that a diameter of the first head portion increases from the flat top surface to the bottom surface,
   the second head portion has a truncated cone shape including a first flat surface, a second surface extending from the outer surface of the rod portion, and a third surface extending from the first flat surface to the second surface of the second head portion and tapered so that a diameter of the second head portion increases from the first flat surface to the second surface of the second head portion, and
   the rod portion extends from the bottom surface of the first head portion to the second surface of the second head portion.

5. The semiconductor device according to claim 4, wherein the diameter of the first head portion at the bottom surface and the diameter of the second head portion at the second surface are greater than a diameter of the rod portion.

6. The semiconductor device according to claim 5, wherein the diameter of the second head portion at the second surface is greater than the diameter of the first head portion at the bottom surface.

7. The semiconductor device according to claim 1, wherein the rod portion of the joint member has a predetermined length when the joint member is detached from the semiconductor module, the printed circuit board and the heatsink, and
   the rod portion is elastically extendable to have an attachment length greater than the predetermined length when the joint member is attached to integrate the semiconductor module, the printed circuit board, and the heatsink to thereby provide the compression force when the joint member is attached to the semiconductor module, the printed circuit board and the heat sink.

8. The semiconductor device according to claim 7, wherein the heatsink includes
   a first through hole extending in the first direction and receiving the rod portion of the joint member, and
   a second through hole extending in the first direction and communicating with the first through hole, the second through hole having a diameter greater than that of the first through hole to receive the second head portion, the printed circuit board includes a third through hole having a diameter less than the diameter of the first through hole and the diameter of the second through hole, and a diameter of the first head portion at the bottom surface is less than a maximum diameter of the second head portion.

9. The semiconductor device according to claim 1, wherein a surface of the heatsink opposite to a surface of the heatsink abutting against the semiconductor module is formed with a hole to embed the second head portion of the joint member.

10. A method for manufacturing a semiconductor device, comprising the steps of:

preparing a semiconductor module having an external terminal protruding from one surface in a first direction, a printed circuit board, a heatsink, and one unitary joint member including a rod portion, a first head portion and a second head portion, the joint member being an elastic element having a compression force in the first direction, the external terminal including a protruding portion extending in a second direction crossing the first direction, the first head portion having a truncated cone shape including a flat top surface, a bottom surface extending outwardly from an outer surface of the rod portion, and a tapered surface extending from the flat top surface to the bottom surface, the first head portion being disposed at one end of the rod portion, and the second head portion being disposed at another end of the rod portion;

electrically and mechanically connecting the printed circuit board to the external terminal of the semiconductor module;

abutting the heatsink against another surface of the semiconductor module;

extending the joint member to insert the joint member into through holes of the semiconductor module, the printed circuit board, and the heat sink disposed to align each other; and sandwiching the semiconductor module, the printed circuit board, and the heatsink between the first head portion and the second head portion disposed at two ends of the joint member to fix the semiconductor module, the printed circuit board, and the heatsink to each other by the compression force of the joint member, wherein the printed circuit board is elastically sandwiched between the first head portion and the protruding portion of the external terminal.

11. A semiconductor device comprising:

a semiconductor module having an external terminal protruding from one surface;

a printed circuit board electrically and mechanically connected to the external terminal of the semiconductor module;

a heatsink abutting against another surface of the semiconductor module opposite to the one surface; and one unitary joint member including a rod portion, a first head portion and a second head portion, the first head portion having a truncated cone shape including a flat top surface, a bottom surface extending outwardly from an outer surface of the rod portion, and a tapered surface extending from the flat top surface to the bottom surface, the first head portion being disposed at one end of the rod portion, and the second head portion being disposed at another end of the rod portion, wherein the first head portion and the second head portion integrate the semiconductor module, the printed circuit board, and the heatsink, the tapered surface of the first head portion is tapered so that a diameter of the first head portion increases from the flat top surface to the bottom surface, the second head portion has a truncated cone shape including a first flat surface, a second surface extending from the outer surface of the rod portion, and a third surface extending from the first flat surface to the second surface of the second head portion and tapered so that a diameter of the second head portion increases from the first flat surface to the second surface of the second head portion, the rod portion extends from the bottom surface of the first head portion to the second surface of the second head portion, the diameter of the first head portion at the bottom surface and the diameter of the second head portion at the second surface are greater than a diameter of the rod portion, and the diameter of the second head portion at the second surface is greater than the diameter of the first head portion at the bottom surface.

* * * * *